United States Patent
Joshi et al.

(10) Patent No.: US 8,315,055 B2
(45) Date of Patent: Nov. 20, 2012

(54) SYSTEMS AND METHODS FOR PROVIDING HEAT TRANSFER

(75) Inventors: Shailesh N. Joshi, Houston, TX (US);
Wen-Chieh Tang, Katy, TX (US);
Daniel T. Thompson, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 56 days.

(21) Appl. No.: 12/500,873

(22) Filed: Jul. 10, 2009

(65) Prior Publication Data
US 2011/0007476 A1 Jan. 13, 2011

(51) Int. Cl.
*H05K 7/20* (2006.01)
(52) U.S. Cl. ........ 361/710; 361/704; 361/709; 361/715; 165/80.2; 165/80.3; 165/185
(58) Field of Classification Search .................. 361/690, 361/692, 694, 695, 697, 704, 707, 715, 717, 361/719, 709
See application file for complete search history.

(56) References Cited

U.S. PATENT DOCUMENTS

| | | | |
|---|---|---|---|
| 5,311,931 A * | 5/1994 | Lee | 165/109.1 |
| 6,615,910 B1 * | 9/2003 | Joshi et al. | 165/80.3 |
| 7,151,668 B1 * | 12/2006 | Stathakis | 361/700 |
| 7,579,687 B2 * | 8/2009 | Szewerenko et al. | 257/707 |
| 7,760,506 B1 * | 7/2010 | Wang et al. | 361/709 |
| 2001/0055458 A1 * | 12/2001 | Ladd | 385/129 |
| 2005/0207115 A1 | 9/2005 | Barsun | |
| 2006/0048921 A1 | 3/2006 | Usui | |
| 2006/0072291 A1 | 4/2006 | Simon | |
| 2006/0129888 A1 * | 6/2006 | Szewerenko et al. | 714/30 |
| 2007/0188995 A1 | 8/2007 | Franz | |
| 2007/0193730 A1 * | 8/2007 | Ozaki | 165/140 |
| 2008/0116571 A1 * | 5/2008 | Dang et al. | 257/721 |
| 2009/0073660 A1 | 3/2009 | Searby | |
| 2009/0103414 A1 | 4/2009 | Joshi | |
| 2009/0190308 A1 * | 7/2009 | Bhattacharya et al. | 361/694 |

* cited by examiner

*Primary Examiner* — Courtney Smith (57) ABSTRACT

There is provided a heat dissipating device. An exemplary heat dissipating device comprises a thermally conductive plate that is adapted to be disposed adjacent to at least one heat generating device. The thermally conductive plate has surface features configured to promote turbulent airflow over the thermally conductive plate, the thickness of the surface features being approximately equal to or less than the thickness of the plate.

14 Claims, 6 Drawing Sheets

|  | 10 CFM | 35 °C Projected | 15 CFM | 35 °C Projected | 20 CFM | 35 °C Projected | 25 CFM |
|---|---|---|---|---|---|---|---|
| Ta (°C) | 23.60 | 35.00 | 24.00 | 35.00 | 23.70 | 35.00 | 23.60 |
| T1 | 56.70 | 68.10 | 47.70 | 59.10 | 42.60 | 54.00 | 39.40 |
| T2 | 67.30 | 78.70 | 56.80 | 68.20 | 50.50 | 61.90 | 46.50 |
| T3 | 57.70 | 69.10 | 48.30 | 59.70 | 43.10 | 54.50 | 39.90 |
| T4 | 67.90 | 79.30 | 56.90 | 68.30 | 50.50 | 61.90 | 46.40 |

FIG. 5

|  | 10 CFM | 35 °C Projected | 15 CFM | 35 °C Projected | 20 CFM | 35 °C Projected | 25 CFM |
|---|---|---|---|---|---|---|---|
| Ta (°C) | 23.20 | 35.00 | 23.40 | 35.00 | 23.30 | 35.00 | 23.60 |
| T1 | 54.10 | 65.90 | 45.20 | 56.80 | 40.70 | 52.30 | 38.10 |
| T2 | 64.00 | 75.80 | 53.70 | 65.30 | 48.00 | 59.60 | 44.40 |
| T3 | 55.30 | 67.10 | 45.70 | 57.30 | 41.00 | 52.60 | 38.30 |
| T4 | 65.50 | 77.30 | 54.50 | 66.10 | 48.40 | 60.00 | 44.70 |

FIG. 6

|     | 10 CFM | 35 °C Projected | 15 CFM | 35 °C Projected | 20 CFM | 35 °C Projected | 25 CFM |
| --- | --- | --- | --- | --- | --- | --- | --- |
| Ta (°C) | 24.70 | 35.00 | 24.50 | 35.00 | 24.70 | 35.00 | 24.70 |
| T1 | 54.70 | 65.00 | 46.00 | 56.30 | 41.70 | 52.00 | 38.90 |
| T2 | 64.80 | 75.10 | 54.40 | 64.70 | 49.00 | 59.30 | 45.30 |
| T3 | 55.40 | 65.70 | 46.40 | 56.70 | 42.00 | 52.30 | 39.00 |
| T4 | 64.20 | 74.50 | 54.10 | 64.40 | 48.60 | 58.90 | 45.00 |

FIG. 7

|     | 13.3 CFM 15 W | 35 °C Projected | 9.8 CFM 11.8 W | 35 °C Projected | 7.4 CFM 9.7 W | 35 °C Projected | 4.7 CFM 7.8 W | 35 °C Projected |
| --- | --- | --- | --- | --- | --- | --- | --- | --- |
| Ta (°C) | 23.1 | 35 | 22.8 | 35 | 22.8 | 35 | 22.9 | 35 |
| T1 | 62.0 | 73.9 | 61.6 | 73.8 | 60.1 | 72.3 | 61.6 | 73.7 |
| T2 | 63.8 | 75.8 | 62.9 | 75.1 | 61.4 | 73.6 | 63.3 | 75.4 |
| T3 | 62.1 | 74.1 | 61.9 | 74.0 | 60.5 | 72.7 | 63.7 | 75.8 |
| T4 | 62.5 | 74.4 | 62.0 | 74.1 | 60.8 | 73.0 | 64.0 | 76.1 |
| T5 | 62.3 | 74.3 | 62.0 | 74.1 | 59.9 | 72.2 | 62.3 | 74.5 |
| T6 | 59.9 | 71.8 | 60.2 | 72.4 | 58.3 | 70.5 | 60.3 | 72.5 |

FIG. 8

|       | 13.3 CFM | 35 °C     | 9.8 CFM | 35 °C     | 7.4 CFM | 35 °C     | 4.7 CFM | 35 °C     |
|       | 15 W     | Projected | 11.9 W  | Projected | 9.7 W   | Projected | 7.8 W   | Projected |
|-------|----------|-----------|---------|-----------|---------|-----------|---------|-----------|
| Ta (°C) | 22.8   | 35        | 23.3    | 35        | 23.0    | 35        | 22.3    | 35        |
| T1    | 59.7     | 71.9      | 61.7    | 73.5      | 60.5    | 72.4      | 61.4    | 74.1      |
| T2    | 61.0     | 73.2      | 62.2    | 73.9      | 61.1    | 73.1      | 62.5    | 75.2      |
| T3    | 59.5     | 71.7      | 61.1    | 72.8      | 60.4    | 72.4      | 63.2    | 75.9      |
| T4    | 59.8     | 72.0      | 60.7    | 72.4      | 60.2    | 72.1      | 63.1    | 75.8      |
| T5    | 59.8     | 72.0      | 61.1    | 72.9      | 60.3    | 72.2      | 62.0    | 74.7      |
| T6    | 55.6     | 67.8      | 58.0    | 69.7      | 57.6    | 69.6      | 59.2    | 71.9      |

FIG. 9

|       | 13.3 CFM | 35 °C     | 9.8 CFM | 35 °C     | 7.4 CFM | 35 °C     | 4.7 CFM | 35 °C     |
|       | 15 W     | Projected | 11.7 W  | Projected | 9.6 W   | Projected | 7.6 W   | Projected |
|-------|----------|-----------|---------|-----------|---------|-----------|---------|-----------|
| Ta (°C) | 23.2   | 35        | 23.0    | 35        | 23.2    | 35        | 23.3    | 35        |
| T1    | 58.6     | 70.4      | 59.3    | 71.3      | 59.3    | 71.0      | 60.6    | 72.3      |
| T2    | 60.9     | 72.7      | 61.3    | 73.3      | 61.2    | 73.0      | 62.8    | 74.5      |
| T3    | 59.4     | 71.2      | 59.6    | 71.6      | 59.6    | 71.4      | 62.6    | 74.3      |
| T4    | 60.5     | 72.3      | 61.3    | 73.3      | 61.1    | 72.9      | 63.7    | 75.4      |
| T5    | 60.0     | 71.8      | 60.3    | 72.3      | 59.8    | 71.5      | 61.8    | 73.5      |
| T6    | 57.6     | 69.4      | 59.0    | 71.0      | 58.7    | 70.4      | 60.3    | 72.0      |

FIG. 10

SYSTEMS AND METHODS FOR PROVIDING HEAT TRANSFER

BACKGROUND

Many of today's high-speed, high-power electronics generate significant amounts of heat. For example, as dual in-line memory modules (DIMMs) are designed to operate at faster operating speeds, they typically consume increasing levels of power and generate more heat. Removing heat from heat-generating devices such as DIMMs is a challenging problem.

BRIEF DESCRIPTION OF THE DRAWINGS

Certain exemplary embodiments are described in the following detailed description and in reference to the drawings, in which.

DETAILED DESCRIPTION OF SPECIFIC EMBODIMENTS

The arrangement of DIMMs in linear banks may cause the air flow across the DIMMs to have laminar flow characteristics, for example, with the air near the surface of DIMM having a low velocity. This may lower the efficacy of cooling of the DIMMs. Exemplary embodiments of the present invention relate to systems and methods for improving heat transfer in electronic devices such as computer systems, blade servers, power supplies or the like.

One exemplary embodiment provides a memory module disposed between two heat spreaders. The heat spreaders contact the top surface of a heat-generating device or component such as memory module chips and dissipate heat away from the heat-generating device. Several memory modules of a memory bank may be disposed in parallel, forming airflow channels between the memory modules. A flow of cooling air may be provided through the airflow channels to draw heat away from the memory modules. The heat spreaders may include surface features, for example, slots, grooves, wires, and the like, that break up the airflow boundary layer attached to the surface of the heat spreaders and increase the turbulence of the air flowing between the memory modules. In this way, the surface features promote greater mixing of the cool air and warm air inside the channel and increase the velocity of the airflow in proximity to the heat spreaders, thus increasing the amount of heat transferred from the heat spreader to the cooling air. Furthermore, the surface features may be small enough to promote turbulence in the airflow channels without significantly reducing the rate of airflow through the channels.

Figure 1:
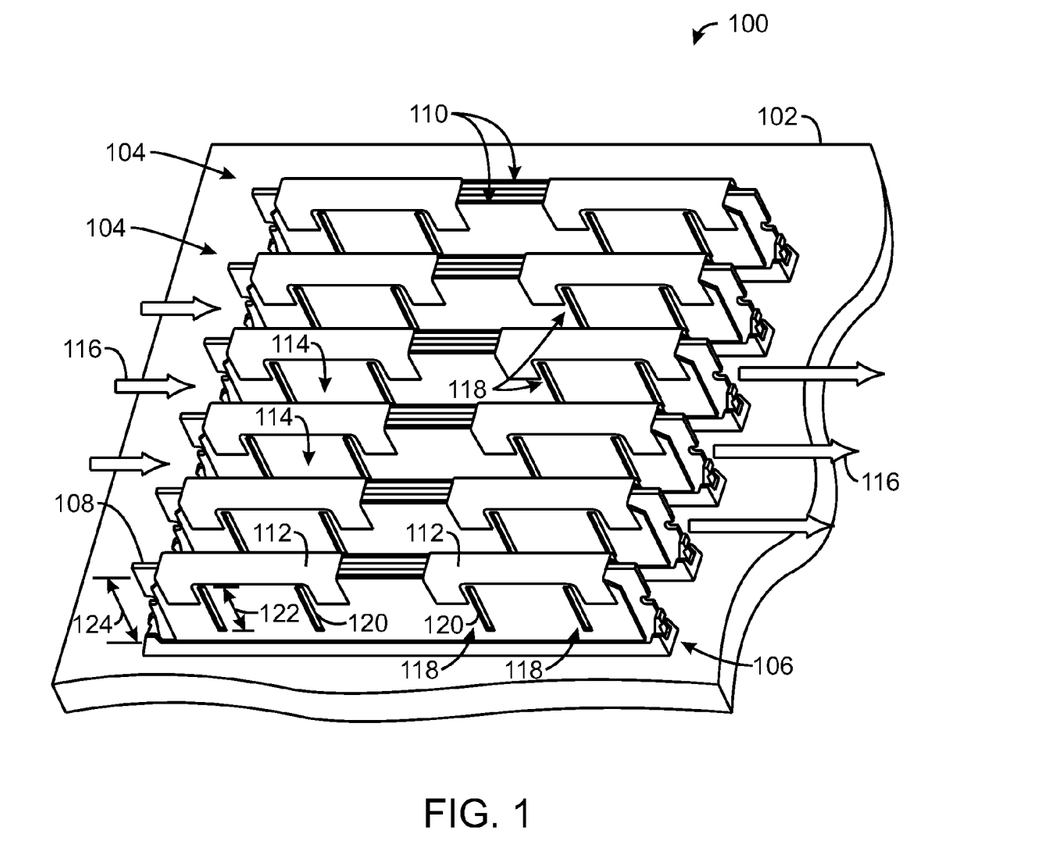
FIG. 1 is a perspective view of a memory bank with several dual in-line memory modules (DIMMs), in accordance with exemplary embodiments of the present invention.

FIG. 1 is a perspective view of a memory bank with several dual in-line memory modules (DIMMs), in accordance with exemplary embodiments of the present invention. The memory bank 100 may be disposed on a circuit board 102 and may include one or more DIMM packages 104 installed in memory slots 106. The memory bank 100 may be included in any suitable computer system, for example, a desktop computer, a blade server, and the like. Although, the memory bank 100 is described as including DIMMs, it will be appreciated that other exemplary embodiments of the present invention may include any suitable type of memory module, for example, single in-line memory modules (SIMMs), single in-line pin packages (SIPPs), and the like. Furthermore, embodiments of the present invention may also be employed to improve the cooling of other types of circuit devices other than memory modules. Exemplary circuit devices may include processors such as microprocessors, graphics processors, application specific integrated circuits (ASICS), and the like. Exemplary circuit devices may also include power semiconductor devices such as insulated gate bipolar transistors (IGBTs), power MOSFETs, and the like. Additional exemplary circuit devices may include power conditioning circuits such as capacitors, inductors, and the like.

Each DIMM package 104 may include a DIMM 108, heat spreaders 110, and clips 112. The DIMM 108 may include one or more memory chips, which may include any suitable type of memory, for example, static random access memory (SRAM), dynamic random access memory (DRAM), synchronous DRAM (SDRAM), double-data-rate (DDR) SDRAM, and the like.

The heat spreaders 110 may include thermally conductive plates that are substantially flat, for example, about 1/16 inch to 1/4 inch thick. The heat spreaders 110 may include any suitable thermally conductive material, for example aluminum, copper, thermally conductive polymer, and the like. The heat spreaders 110 may be disposed on both sides of the DIMM 108 and abut the top surface of the memory chips included in the DIMM 108. Furthermore, a layer of thermal grease may be disposed between the heat spreader 110 and the memory chips of the DIMM 108 to increase the thermal conductivity between the DIMM 108 and the heat spreader 110. The clips 112 may straddle the top edge of the DIMM package 104 and grip the sides of the heat spreaders 110 to hold the heat spreaders 110 in contact with the DIMM 108. The clips 112 may be made of any suitable resilient material, for example, aluminum, plastic, and the like.

The parallel arrangement of the DIMM packages 104 provides air channels 114 between the dim packages 104. In exemplary embodiments of the present invention, fans may provide a flow of cooling air 116 through the air channels 114 between the DIMM packages 104. The cooling air 116 draws heat from the heat spreaders 110 and cools the DIMMs 108. To increase the amount of heat transfer from the DIMMs 108 to the cooling air 116, the heat spreaders 110 may also include surface features 118. As will be described further below, the surface features 118 may include, for example, slots, holes, grooves, dimples, and the like. Additionally, the surface features 118 may be raised protrusions, for example, wires, buttons, and the like.

The thickness of the surface features 118 may be approximately equal to or less than the thickness of the heat spreaders 110. For example, if the surface features 118 are cut into the heat spreaders 110 they may extend all the way through the head spreader 110 or only partly through the heat spreaders 110, as discussed in further detail with respect to FIG. 3. Similar, if raised protrusions are used, the protrusions may extend out from the heat spreaders 110 by a distance that is less than the thickness of the heat spreaders 110.

Without the surface features 118, the cooling air 116 flowing through the air channels 114 may have laminar flow characteristics. In that case, a boundary layer may form over the surface of the heat spreaders 110 as the cooling air 116 passes through the air channel 114. The boundary layer may cause warmer air at the surface of the heat spreaders 110 to stay in contact with the heat spreaders 110 while higher-velocity, cooler air near the center-line of the air channel 114 will tend to stay near the center-line and away from the heat spreaders 110. Thus, the laminar airflow through the air channels 114 may decrease the amount of cooling air that contacts the heat spreaders 110, which may tend to reduce the level of heat transfer from the DIMMs 108 to the cooling air 116.

The surface features 118 increase the heat dissipation of the heat spreader 110 by disrupting the boundary layers and promoting turbulent airflow in the air channel 114 near the surface of the heat spreader 110. In this way, the surface features 118 promote greater mixing of the cooler and warmer air within the air channel 114 and, thus, increase the level of heat transfer from the DIMMs 108 to the cooling air 116.

In one exemplary embodiment of the present invention, the surface features 118 may include parallel slots 120, which pass through the heat spreader 110. The slots 120 may be oriented perpendicular to the flow of cooling air 116, as shown, and the length 122 of the slots 120 may be any fraction of the height 124 of the heat spreader 110, for example, 20, 40, 60, or 80 percent. In other exemplary embodiments, the slots 120 may be set at an angle relative to the flow of cooling air 116. Furthermore, the heat spreader 110 may include any number of slots 120, from 1 to about 10 or more. In some exemplary embodiments, the heat spreaders 110 may include four slots 120 disposed at about 10, 30, 70, and 90 percent of the length of the heat spreader 110 from the edge of the heat spreader 110. The slots 120 may be formed in the heat spreaders 110 using any techniques suitable for the material. In an exemplary embodiment, the slots 120 may be cut into the heat spreader 110 using a cutting tool. In other embodiments, the slots 120 may be formed into the heat spreaders 110, such as by an injection molding process used to form the heat spreaders 110 from a thermally-conductive plastic.

In addition to promoting turbulent flow, the slots 120 may also provide a flow of air through the heat spreader 110. In this way, warm air that may otherwise tend to remain trapped between the DIMM 108 and the heat spreader 110 may be released into the air channel 114.

Figure 2:
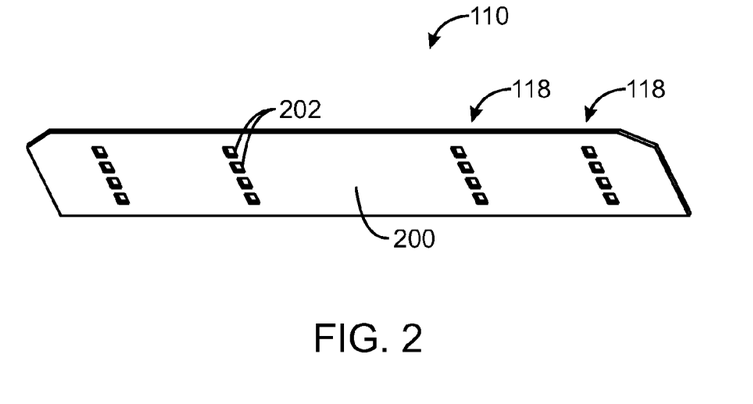
FIG. 2 is a perspective view of a heat spreader with segmented slots, in accordance with exemplary embodiments of the present invention.

FIG. 2 is a perspective view of a heat spreader 110 with segmented slots 120 used for the surface features 118, in accordance with exemplary embodiments of the present invention. As with the slots 120 discussed with respect to FIG. 1, the heat spreader 110 may include any number of segmented slots 200, which may be oriented perpendicular to the flow of cooling air 116, and the length of the segmented slots 200 may be any fraction of the height 124 of the heat spreader 110. Furthermore, the segmented slots 200 may be divided into a plurality of segments 202, for example, 2, 3, 4, 5 or more segments. As with the full slots 120 of FIG. 1, the segmented slots 200 serve to break the boundary layer and promote turbulent airflow in the air channels 114. Additionally, the material between the segments may conduct heat across the segmented slots 200. Therefore, the segmented slots 200 may provide additional heat spreading along the length of the heat spreader 110 compared to a heat spreader 110 with full slots 120. In some exemplary embodiments, the heat spreader 110 may include a combination of full slots 120 and segmented slots 200.

Figure 3:
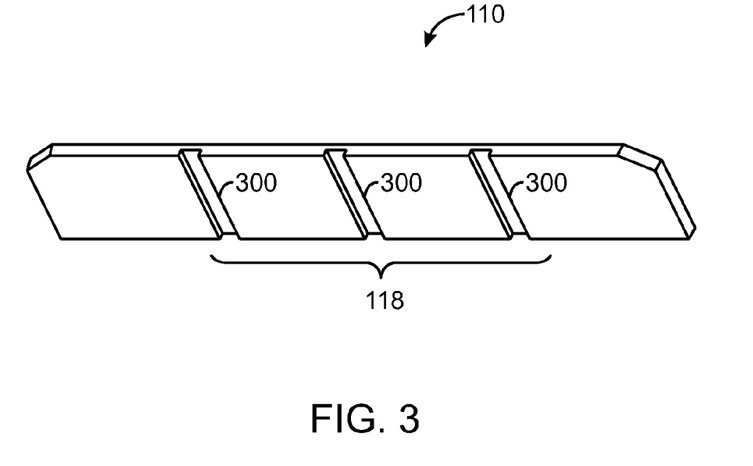
FIG. 3 is a perspective view of a heat spreader with grooves, in accordance with exemplary embodiments of the present invention.

FIG. 3 is a perspective view of a heat spreader with grooves 300 used for the surface features 118, in accordance with exemplary embodiments of the present invention. Unlike the slots 120, the grooves 300 do not pass completely through the heat spreader 110. The grooves 300 may be formed by cutting the groove 300 in the surface of the heat spreader 110 using, for example, a milling machine. In other exemplary embodiments, the grooves 300 may be formed as a half-shear, in which case the inside surface of the heat spreader 110 may be raised. In yet other exemplary embodiments, the grooves 300 may be molded into the plate, for example, in a thermoforming operation to form the heat spreader 110 from a conductive plastic. Accordingly, the grooves 300 may be positioned so that the raised surfaces are located between the memory chips of the DIMM 108.

As with the full slots 120 of FIG. 1 and the segmented slots 200 of FIG. 2, the grooves 300 serve to break the boundary layer and promote turbulent airflow in the air channels 114. However, the grooves 300 may provide additional heat spreading along the length of the heat spreader 110 compared to a heat spreader 110 with either full slots 120 or segmented slots 200. In some exemplary embodiments, the heat spreader 110 may include segmented grooves 300, similar to the segmented slots of FIG. 2.

Figure 4:
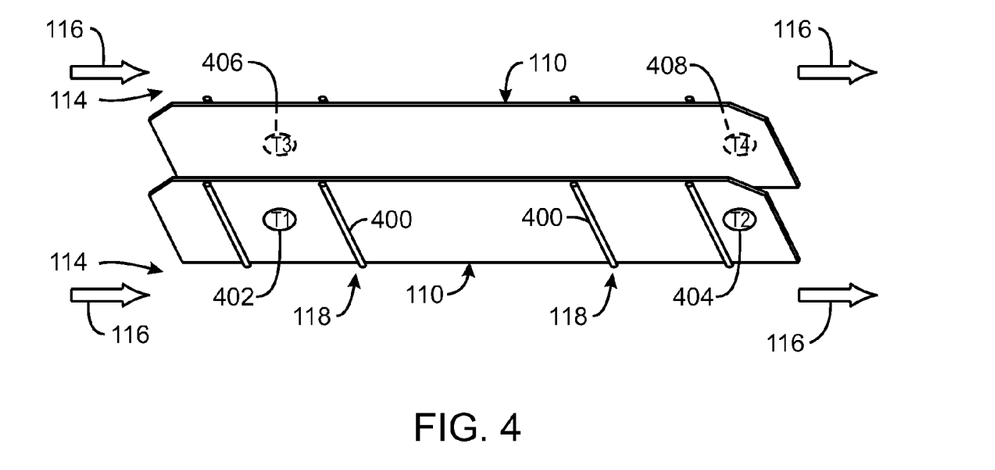
FIG. 4 is a perspective view of a heat spreader with raised surface features, in accordance with exemplary embodiments of the present invention.

FIG. 4 is a perspective view of a heat spreader with raised surface features, in accordance with exemplary embodiments of the present invention. The surface features 118 may include raised surface features such as wires 400. The wires 400 may include any suitable material, for example, plastic, metal, ceramic, and the like. In some exemplary embodiments, the wires may be thermally non-conductive. For purposes of the present description, a material may be considered thermally non-conductive if the thermal conductivity of the material is less than about 1 Watt/(meter·kelvin). The wires 400 may be welded to the heat spreader 110 or coupled to the heat spreader 110 with an adhesive. The wires 400 may be any suitable size, for example, 15 gauge to 40 gauge.

The wires 400 may be oriented perpendicular to the flow of cooling air 116 as shown, and the length 122 of the wires 400 may be any fraction of the height of the heat spreader 110, for example, 20, 40, 60, 80, or 100 percent. In other exemplary embodiments, the wires 400 may be set at an angle with respect to the flow of cooling air 116. Furthermore, the heat spreader 110 may include any number of wires 400, from 1 to about 10 or more. In some exemplary embodiments, the heat spreaders 110 may include four wires 400 disposed at approximately 10, 30, 70, and 90 percent of the length of the heat spreader 110 from the edge of the heat spreader 110.

As with the slots 120 discussed in reference to FIG. 1, the wires disrupt the boundary layer and promote turbulent flow in the air channels 114. As a result, eddy currents may be formed near the surface of the heat spreader 110, which promote the mixing of cooler and warmer air within the air channel 114 near the surface of the heat spreaders 110. In this way, the cooling air 116 may tend to draw more heat from the heat spreader 100 compared to flat heat spreaders, and the thermal transfer from the DIMMs 108 to the cooling air 116 may be increased. Exemplary embodiments of the present invention may include heat spreaders 110 with any combination of surface features 118.

Figure 5:
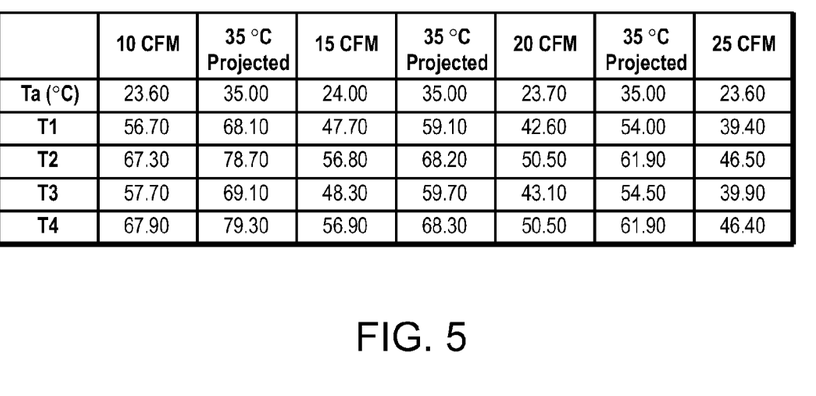
FIG. 5 represents the baseline DIMM temperature measurements of a heat spreader without surface features.
Figure 6:
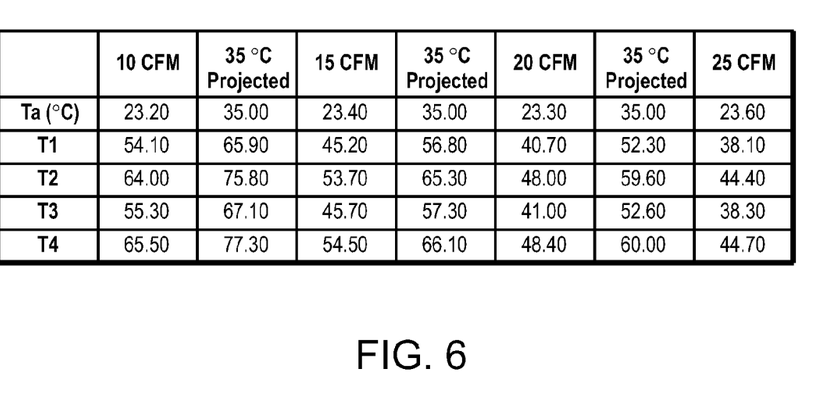
FIG. 6 represents the DIMM temperature measurements recorded using heat spreaders with 30 gauge wire surface features, in accordance with embodiments of the present invention.
Figure 7:
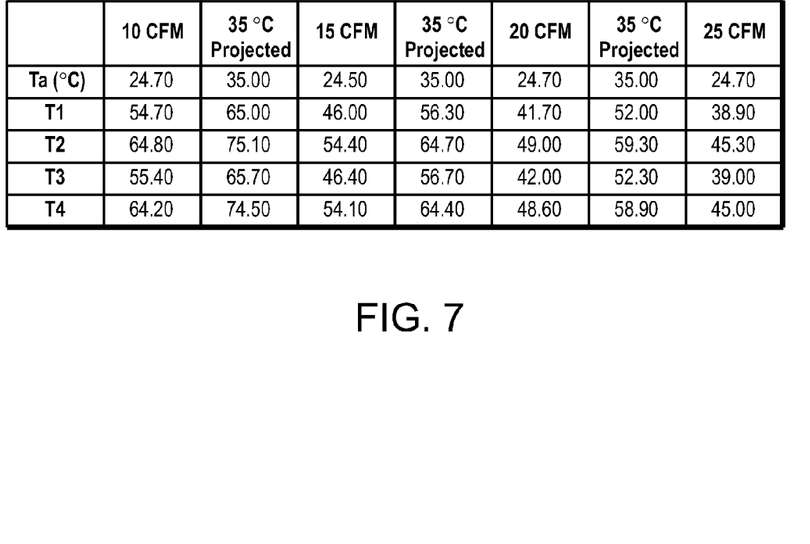
FIG. 7 represents the DIMM temperature measurements recorded using heat spreaders with 28 gauge wire surface features, in accordance with embodiments of the present invention.

FIGS. 5, 6, and 7 show test results that demonstrate the effectiveness of heat spreaders 110 with wires 400 in accordance with present embodiments. To obtain the following test results, a simulated memory bank was modeled using simulated DIMMs that included 15 Watt electrical heaters to simulate the heat generated by the memory chips of the DIMM 108. Heat spreaders 110 with were disposed on both sides of the simulated DIMM, and four thermocouples 402, 404, 406, 408 were placed on the surface of the heat spreaders 110 to measure the temperature of the simulated DIMMs. The simulated memory bank was placed in an air duct and a flow of cooling air 116 was driven through the air channels 114 of the simulated memory bank. Furthermore, a baffle was placed over the simulated DIMMs so that the cooling air flowed only through the air channels 116 between the simulated DIMMs. Temperatures from thermocouples were then measured at various airflow speeds.

The approximate locations of the thermocouples 402, 404, 406, 408 during the tests represented in FIGS. 5-7 are shown in FIG. 4. The T1 thermocouple 402 and the T3 thermocouple 404 were placed just downstream from the upstream wire 400 on opposite sides of the simulated DIMM. The T2 thermocouple 406 and T4 thermocouple were placed just downstream from the downstream wire 400 on opposite sides of the simulated DIMM.

FIG. 5 represents the baseline DIMM temperature measurements of a heat spreader 110 without surface features 118. FIGS. 6 and 7 represent the DIMM temperature measurements recorded using heat spreaders 110 with surface features 118 in accordance with embodiments of the present invention. Specifically, the heat spreaders 110 used in the tests represented by FIGS. 6 and 7 included four thermally non-conductive wires disposed at approximately 10, 30, 70, and 90 percent of the length of the heat spreader 110, as shown in FIG. 4. FIG. 6 represents heat spreaders 110 with 30 gauge wires attached, and FIG. 7 represents heat spreaders 110 with 28 gauge wires attached.

The columns labeled "10 CFM," "15 CFM," "20 CFM," and "25 CFM" represent airflow speeds of 10, 15, 20, and 25 cubic feet per minute, respectively. The columns labeled "35° C. projected" represent the estimated temperature results for an ambient temperature of 35 degrees Celsius. The rows labeled "Ta" represent the measured air temperature of the ambient air before flowing through the simulated memory bank. The rows labeled "T1," "T2," "T3," and "T4" represent temperature measurements from the four thermocouples 402, 404, 406, 408 located on the outside of the simulated DIMM package.

The temperature measurements shown in FIGS. 5-7, demonstrate that the heat spreaders 110 with the wires 400 provided significantly greater cooling than the baseline heat spreaders without wires 400. For example, at an air flow rate of 10 CFM the heat spreaders with 30 gauge wires provide approximately 2.5 to 3.5° C. greater cooling compared to the baseline and the heat spreaders with 28 gauge wires provide approximately 2 to 2.5° C. greater cooling compared to the baseline.

Figure 8:
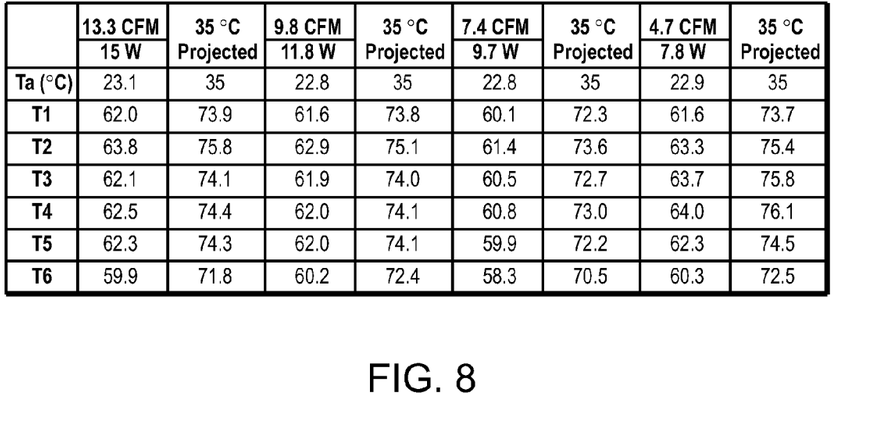
FIG. 8 represents another set of baseline DIMM temperature measurements of a heat spreader without surface features.
Figure 9:
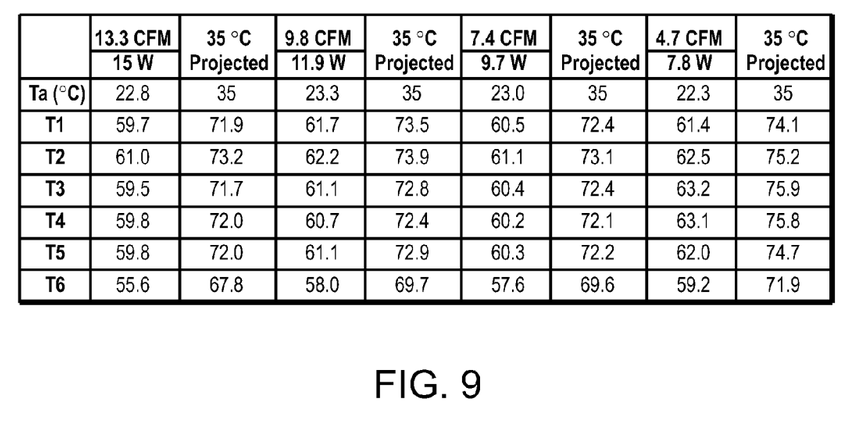
FIG. 9 represents temperature measurements recorded using heat spreaders with 1 mm wide slots, in accordance with embodiments of the present invention.
Figure 10:
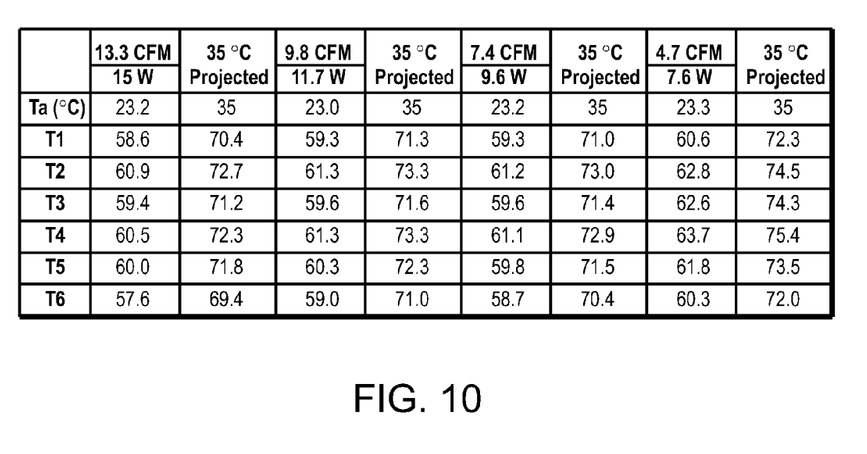
FIG. 10 represents temperature measurements recorded using heat spreaders with 2 mm wide slots, in accordance with embodiments of the present invention.

FIGS. 8, 9 and 10 show test results that demonstrate the effectiveness of heat spreaders 110 with slots 120 in accordance with present embodiments. To obtain the following test results, a simulated memory bank was modeled using simulated DIMMs that included electrical heaters to simulate the heat generated by the memory chips of the DIMM 108. Heat spreaders 110 with were disposed on both sides of the simulated DIMM, and six thermocouples were placed on the surface of the heat spreaders 110 to measure the temperature of the simulated DIMMs. The simulated memory bank was placed in an air duct and a flow of cooling air 116 was driven through the air channels 114 of the simulated memory bank. Furthermore, a baffle was placed over the simulated DIMMs so that the cooling air flowed only through the air channels 116 between the simulated DIMMs. Temperatures from the six thermocouples were then measured at various airflow speeds and DIMM Wattage ratings.

FIG. 8 represents another set of baseline DIMM temperature measurements of a heat spreader 110 without surface features 118. By comparison, FIGS. 9 and 10 represent the temperature measurements recorded using heat spreaders 110 with slots 120 accordance with embodiments of the present invention. Specifically, the heat spreaders 110 used in the tests represented by FIGS. 9 and 10 included two slots 120 disposed at approximately 10 and 70 percent of the length of the heat spreader 110. FIG. 9 represents heat spreaders 110 with 1 mm wide slots 120, and FIG. 10 represents heat spreaders 110 with 2 mm wide slots 120.

The columns labeled "13.3 CFM," "9.8 CFM," "7.4 CFM," and "4.7 CFM" represent airflow speeds of 13.3, 9.8, 7.4, and 4.7 cubic feet per minute, respectively. Additionally, the wattage rating of the simulated DIMMs during each test is located below the "CFM" column heading. The columns labeled "35° C. projected" represent the estimated temperature results for an ambient temperature of 35 degrees Celsius. The rows labeled "Ta" represent the measured air temperature of the ambient air before flowing through the simulated memory bank. The rows labeled "T1," "T2," "T3," "T4," "T5," and "T6" represent temperature measurements from the six thermocouples located on the outside of the simulated DIMM package.

The temperature measurements shown in FIGS. 8, 9, and 10, demonstrate that the heat spreaders 110 with the slots 120 provided significantly greater cooling than the baseline heat spreaders without slots 120. For example, at an air flow rate of 13.3 CFM and DIMM power rating of 15 W, both of the slotted heat spreaders 110 provide approximately 2.5° C. greater cooling compared to the baseline.

What is claimed is:

1. A heat dissipating device, comprising a thermally conductive plate to be disposed adjacent to at least one heat generating device, the thermally conductive plate having surface features that promote turbulent airflow over the thermally conductive plate, wherein the surface features comprise parallel grooves disposed in the plate at an angle perpendicular to the airflow and parallel wires disposed along a surface of the plate at an angle perpendicular to the airflow, a depth of the surface features being less than the thickness of the thermally conductive plate.

2. The heat dissipating device of claim 1, wherein the wires are thermally non-conductive.

3. The heat dissipating device of claim 1, wherein the wires are coupled to the plate with an adhesive.

4. An electronic device, comprising:
   two or more circuit devices disposed in parallel to each other and forming an air channel between circuit devices;
   a fan that provides airflow through the air channel to cool the circuit devices; and
   two or more thermally conductive plates disposed in the air channel adjacent to the circuit devices, wherein the thermally conductive plates include surface features that promote turbulent airflow in the air channel, wherein the surface features comprise parallel wires disposed lengthwise along a surface of the plates at an angle perpendicular to the airflow and parallel grooves disposed along a surface of the plates at an angle perpendicular to the airflow, a depth of the surface features being less than a thickness of the thermally conductive plate.

5. The electronic device of claim 4, wherein the circuit devices include memory modules.

6. The electronic device of claim 4, wherein the circuit devices include processors.

7. The electronic device of claim 4, wherein the circuit devices include power semiconductors.

8. A method of dissipating heat via a heat spreader, the method comprising:
  providing a flat, thermally conductive plate;
  applying surface features along a first side of the plate to increase the turbulence of an airflow over the plate, wherein applying surface features to the plate comprises producing a groove in the plate, wherein a depth of the surface features is less than a thickness of the thermally conductive plate; and
  placing a second side of the plate in contact with one or more electronic components that generate heat during operation;
  wherein the groove is segmented.

9. The method of claim 8, comprising coupling a wire to the plate.

10. The method of claim 9, wherein the wire is thermally non-conductive.

11. The method of claim 9, wherein the wire is coupled to the plate with a thermal adhesive.

12. The method of claim 1, wherein the grooves are segmented.

13. The heat dissipating device of claim 4, wherein the wires are thermally non-conductive.

14. The heat dissipating device of claim 4, wherein the wires are coupled to the plate with an adhesive.

* * * * *